United States Patent
Goumas et al.

(10) Patent No.: US 8,669,829 B2
(45) Date of Patent: Mar. 11, 2014

(54) MULTI-OCTAVE POWER AMPLIFIER

(75) Inventors: William Goumas, Rancho Cordova, CA (US); Yehuda Goren, Scotts Valley, CA (US)

(73) Assignee: Teledyne Wireless, LLC, Thousand Oaks, CA (US)

( * ) Notice: Subject to any disclaimer, the term of this patent is extended or adjusted under 35 U.S.C. 154(b) by 108 days.

(21) Appl. No.: 13/405,776

(22) Filed: Feb. 27, 2012

(65) Prior Publication Data

US 2013/0222061 A1    Aug. 29, 2013

(51) Int. Cl.
*H03H 7/38* (2006.01)

(52) U.S. Cl.
USPC .................. 333/25; 333/33; 333/34

(58) Field of Classification Search
USPC .......................... 333/25, 26, 32–34
See application file for complete search history.

(56) References Cited

U.S. PATENT DOCUMENTS

| 6,788,164 | B2 * | 9/2004 | Maekawa et al. | 333/26 |
| 6,828,881 | B2 * | 12/2004 | Mizutani et al. | 333/204 |
| 7,205,861 | B2 * | 4/2007 | Inoue et al. | 333/25 |
| 7,256,663 | B2 * | 8/2007 | Yasuda et al. | 333/26 |
| 7,283,793 | B1 * | 10/2007 | McKay | 455/83 |
| 7,486,141 | B2 * | 2/2009 | Do et al. | 330/276 |
| 7,663,448 | B2 * | 2/2010 | Harada et al. | 333/26 |

* cited by examiner

*Primary Examiner* — Robert Pascal
*Assistant Examiner* — Kimberly Glenn
(74) *Attorney, Agent, or Firm* — K&L Gates LLP

(57) ABSTRACT

A multi-octave power amplifier and related method provides an impedance matching unit configured to match impedances of a pair of balanced radio frequency (RF) signals applied thereto and output a pair of impedance-matched balanced RF signals, a converting unit configured to convert the pair of the impedance-matched balanced RF signals to an unbalanced RF signal and a compensation unit configured to compensate at least one rolled-off frequency component of the unbalanced RF signal and output a compensated RF signal.

20 Claims, 4 Drawing Sheets

MULTI-OCTAVE POWER AMPLIFIER

BACKGROUND

1. Field of the Disclosure

The disclosure is directed to a multi-octave amplifier and, more particularly, to a multi-octave high power amplifier (MOHP) configured for providing good performance.

2. Related Art

In some amplifier designs, multi-octave performance may be achieved for matching circuits using coaxial transformers and ferrite loading. However, this technique is generally limited to frequencies below about 600 MHz.

In another common design technique, multi-octave performance may be achieved over about 20 MHz to about 1.5 GHz by matching a device only at the high end of the range. This results in mismatching of the device at the low end of the range. Where the device is a gallium nitride (GaN) device, the inherent gain and efficiency may be so large that the gain and efficiency of the device, when degraded due to the mismatch, may still be acceptable. For example, the resultant gain and efficiency may be acceptable over the decade plus range. However, this technique is limited to frequencies below about 1.5 GHz and power levels of about 20 W with existing device technology.

SUMMARY OF THE DISCLOSURE

The limitations described above may be overcome by a multi-octave amplifier that is constructed according to the principles of the disclosure. The multi-octave amplifier may achieve good performance over multiple octaves for frequencies ranging from 0.5 GHz to about 1 GHz, as well as for frequency ranges below about 0.5 GHz or above about 1 Ghz.

In one aspect, a multi-octave power amplifier is provided that includes an impedance matching unit configured to match impedances of a pair of balanced radio frequency (RF) signals applied thereto and output a pair of impedance-matched balanced RF signals, a converting unit configured to convert the pair of the impedance-matched balanced RF signals to an unbalanced RF signal, and a compensation unit configured to compensate at least one rolled-off frequency component of the unbalanced RF signal and output a compensated RF signal.

The pair of balanced RF signals may comprise a first balanced RF signal and a second balanced RF signal, and the pair of impedance-match balanced signals may comprise a first impedance-matched balanced RF signal and a second impedance-matched balanced RF signal. The impedance matching unit may comprise a pair of matching transformers that include a first matching transformer that receives the first balanced RF signal and outputs the first impedance-matched balanced RF signal, and a second matching transformer that receives the second balanced RF signal and outputs the second impedance-matched balanced RF signal.

The real part of the impedances of the pair of balanced RF signals may be, for example, between about 3 ohm and about 5 ohm.

The first matching transformer may comprise a first tapered transformer, and the second matching transformer comprises a second tapered transformer. The first tapered transformer and the second tapered transformer may be substantially identical.

The converting unit may comprise a balun. The balun may comprise a first input connected to the first matching transformer to receive the first impedance-matched balanced RF signal therefrom, a second input connected to the second matching transformer to receive the second impedance-matched balanced RF signal therefrom, and an output connected to the compensation unit to output the unbalanced RF signal thereto.

The compensation unit may comprise a matching filter connected to the output of the balun. The matching filter may comprise a high pass and low pass (HP/LP) matching filter that compensates the at least one rolled-off frequency component of the unbalanced RF signal. The at least one rolled-off frequency component of the unbalanced RF signal may comprise a rolled-off high frequency component that occupies a high frequency range of the unbalanced RF signal between, for example, about 2900 MHz and about 3200 MHz, and a rolled-off low frequency component that occupies a low frequency range of the unbalanced RF signal between, for example, about 800 MHz and about 1000 MHz. The at least one rolled-off frequency component of the unbalanced RF signal may be compensated by about 10% to about 20% of bandwidth. In another aspect, a method for amplifying a radio frequency (RF) signal includes the steps of receiving a pair of balanced RF signals, matching impedances of the pair of balanced radio frequency (RF) signals to generate a pair of impedance-matched balanced RF signals, converting the pair of impedance-matched balanced RF signals to an unbalanced RF signal and compensating at least one rolled-off frequency component of the unbalanced RF signal to output a compensated RF signal.

In the method, the pair of balanced RF signals may comprise a first balanced RF signal and a second balanced RF signal, and the pair of impedance-matched balanced signals may comprise a first impedance-matched balanced RF signal and a second impedance-matched balanced RF signal. The first balanced RF signal may be transformed to the first impendence-matched balanced RF signal by a first tapered transformer, and the second balanced RF signal may be transformed to the second impendence-matched balanced RF signal by a second tapered transformer. The first tapered transformer and the second tapered transformer may be substantially identical. The real part of the impedances of the pair of balanced RF signals may be, for example, between about 3 ohm and about 5 ohm. The first and second impedance-matched balanced RF signals may be converted to the unbalanced RF signal by a balun connected to the first and second tapered transformers. The at least one rolled-off frequency component of the unbalanced RF signal may comprise a rolled-off high frequency component that occupies a high frequency range of the unbalanced RF signal between, for example, about 2900 MHz and about 3200 MHz, and a rolled-off low frequency component that occupies a low frequency range of the unbalanced RF signal between, for example, about 800 MHz and about 1000 MHz. The at least one rolled-off frequency component of the unbalanced RF signal may be compensated by about 10% to about 20% of bandwidth. The rolled-off high and low frequency components of the unbalanced RF signal may be compensated by a matching filter. The matching filter may comprise a high pass and low pass (HP/LP) matching filter connected to the balun.

Additional features, advantages, and embodiments of the disclosure may be set forth or apparent from consideration of the detailed description and drawings. Moreover, it is to be understood that the foregoing summary of the disclosure and the following detailed description and drawings are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate various aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

Figure 1:
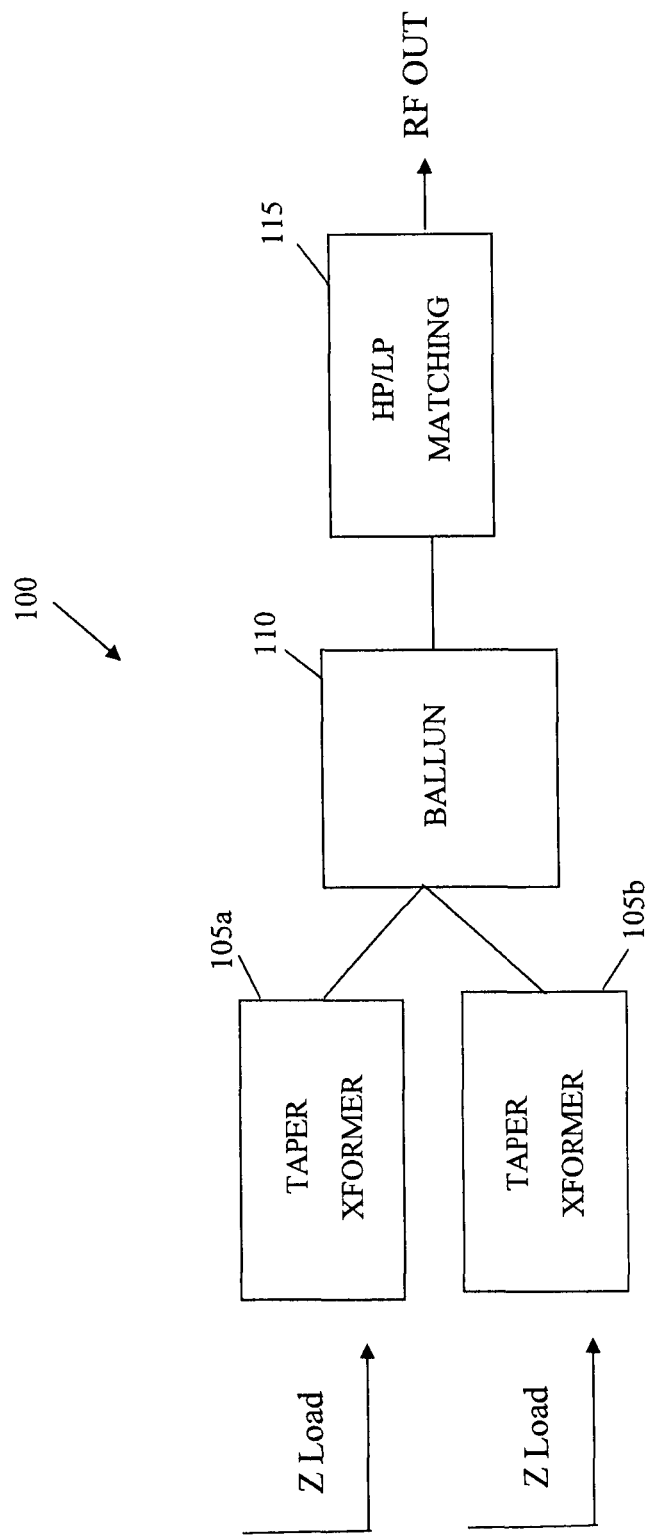
FIG. 1 is a bock diagram of an example of an output circuit, configured according to principles of the disclosure.

The present disclosure is further described in the detailed description that follows.

DETAILED DESCRIPTION OF THE DISCLOSURE

The various aspects of the disclosure and the various features and advantageous details thereof are explained more fully with reference to the non-limiting examples that are described and/or illustrated in the accompanying drawings and detailed in the following description. It is noted that the features illustrated in the drawings are not necessarily drawn to scale, and features of one example may be employed with other examples as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the principles of the disclosure. Accordingly, the examples and embodiments herein should not be construed as limiting the scope of the disclosure, which is defined solely by the appended claims and applicable law. Moreover, it is noted that like reference numerals represent similar parts throughout the several views of the drawings.

The disclosure is not limited to the particular methodology, protocols, devices, apparatus, materials, applications, etc., described herein, as these may vary. The terminology used herein is used for the purpose of describing particular examples only, and is not intended to limit the scope of the disclosure. It must be noted that as used herein and in the appended claims, the singular forms "a," "an," and "the" include plural reference unless the context clearly dictates otherwise.

The terms "including", "comprising" and variations thereof, as used in this disclosure, mean "including, but not limited to", unless expressly specified otherwise.

Unless defined otherwise, all technical and scientific terms used herein have the same meanings as commonly understood by one of ordinary skill in the art to which this disclosure belongs. Preferred methods, devices, and materials are described, although any methods and materials similar or equivalent to those described herein can be used in the practice or testing of the disclosure.

Devices that are in communication with each other need not be in continuous communication with each other, unless expressly specified otherwise. In addition, devices that are in communication with each other may communicate directly or indirectly through one or more intermediaries.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

FIG. 1 shows an example of a bock diagram of an output circuit 100, configured according to principles of the disclosure. The circuit 100 comprises an impedance matching section (or unit), a converting section (or unit), and a compensation section (or unit). The impedance matching section is configured to match impedances of a pair of balanced radio frequency (RF) signals applied thereto and output a pair of impedance-matched balanced RF signals. The converting unit is configured to receive the impedance-matched balanced RF signals and convert the signals to an unbalanced RF signal. The compensation section (or unit) is configured to compensate at least one rolled-off frequency component of the unbalanced RF signal and output a compensated RF signal. In the example shown in FIG. 1, the output circuit 100 is configured to include a plurality of transformers 105a, 105b (e.g., two transformers), a balun 110, and an HP/LP matching circuit (or HP/LP match) 115.

The transformers 105a, 105b may be (or include) tapered transformers, which may be configured to receive a plurality of signals (e.g., two Zload signals) and output a plurality of respective impedance-matched balanced RF signals (e.g., two RF signals). The real part of the impedance Zload to the transformers 105a, 105b may be about 3 ohms to about 5 ohms for this example, which is typical for today's devices; but, other impedance levels are also contemplated, including impedances greater than 5 ohms, or less than 3 ohms. This low impedance level/load line is an example of a level that may be presented to a device operating at 28 V to output an RF output signal of, e.g., about 50 W to about 100 W.

The balun 110 may be (or include) an off-the-shelf balun that may be configured to receive the plurality of impedance-matched balanced RF signals from the transformers 105a, 105b and convert the RF signals to an unbalanced RF signal, or conversely convert an unbalanced RF signal to a plurality of impedance-matched balanced RF signals.

The HP/LP matching circuit (or HP/LP match) 115 may include a band-pass or high-pass/low-pass (HP/LP) matching filter that results in a multi-octave match to low impedance.

Figure 2:
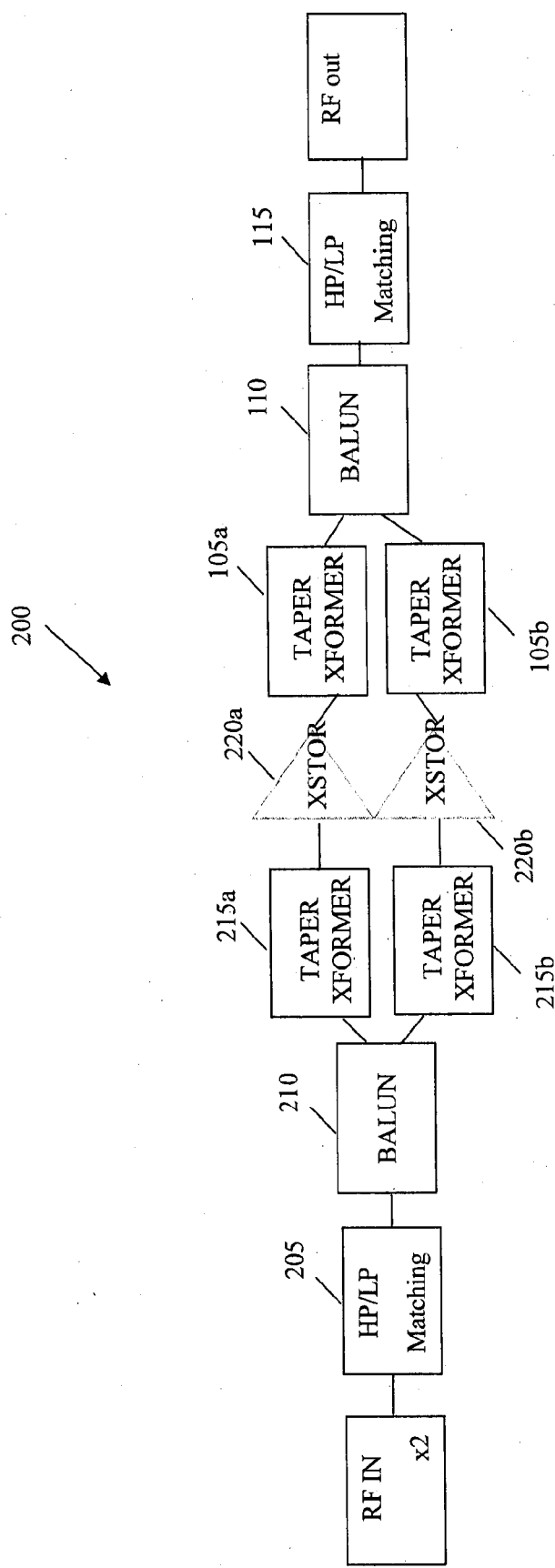
FIG. 2 is a block diagram of an example of a multi-octave high power amplifier stage, configured according to principles of the disclosure.

FIG. 2 shows an example of a block diagram of a multi-octave high power (MOHP) amplifier 200, configured according to principles of the disclosure. The MOHP amplifier 200 may be configured to include the output circuit of FIG. 1, as seen in FIG. 2. The MOHP amplifier 200 may further include a HP/LP matching circuit (or HP/LP match) 205, a balun 210, a plurality of transformers 215a, 215b, and a plurality of transistors 220a, 220b.

The HP/LP match 205 may be configured to receive an input RF signal (RF IN) and filter the received RF signal, outputting a band-pass RF signal to the balun 210. The HP/LP match 205 may include a high-pass/low-pass matching filter that may help to compensate a frequency roll-off of the balun 210 at the high end and/or low end of a desired frequency range (e.g., about 0.5 GHz to about 1.0 GHz).

The transformers 215a, 215b may include tapered transformers (which may be substantially identical) that may be configured to match the impedance level (e.g., about 25 ohm) from the balun 210 to an impedance level (e.g., about 3 ohm to about 5 ohm) at the inputs of the transistors 220a, 220b. The reverse may happen at the outputs of the transistors 220a, 220b, wherein the transistors 220a, 220b, may be configured to match the impedance level (e.g., about 3 ohm to about 5 ohm) at the inputs of the transistors 220a, 220b, to an impedance level (e.g., about 50 ohm) at the output of the MOHP amplifier 200. The transistors 220a, 220b may be (or include), for example, Cree CGH40045(45 W) GaN high electron mobility transistor (HEMT) manufactured by Cree, Inc.

In general, the HP/LP match 115 may be placed at nearly any suitable location in the MOHP amplifier 200. However, it may be more convenient to have the HP/LP match 115 configured in the unbalanced section of the MOHP amplifier 200, e.g., before the balan 210 on the input side, and after the balun 110 on the output side (such as shown in relation to e.g., HP/LP match 115).

Figure 3:
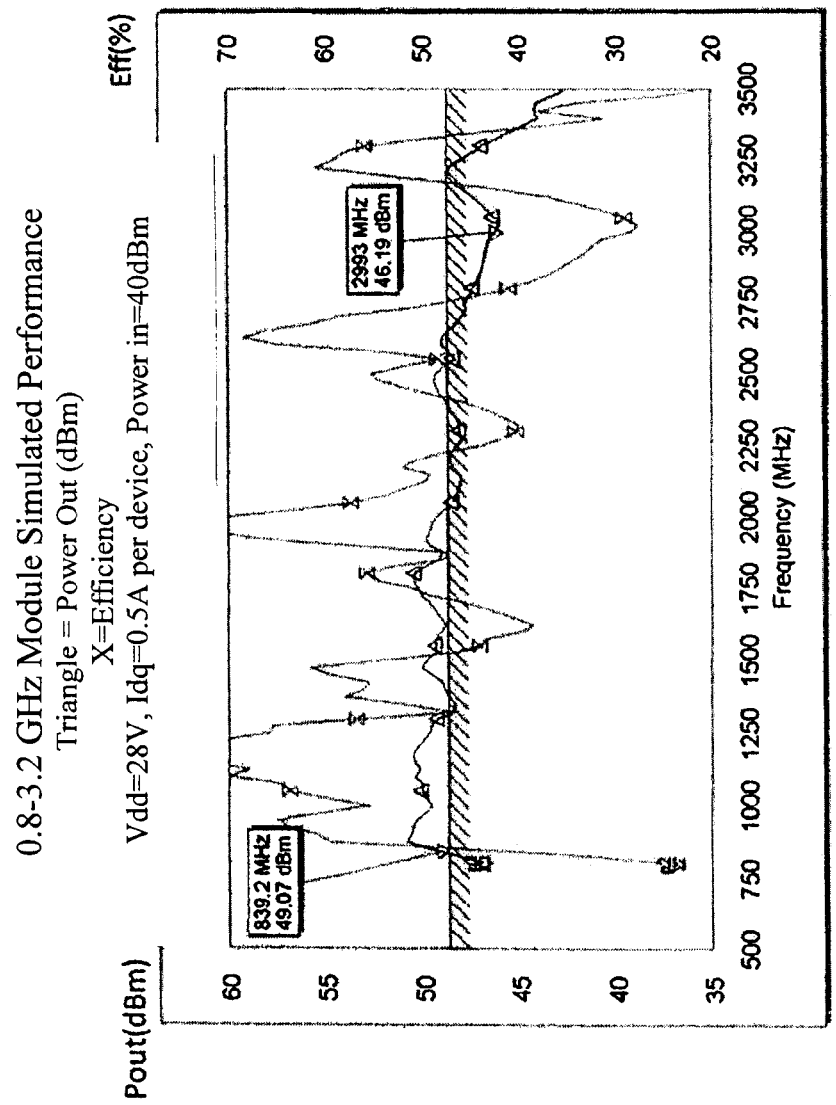
FIG. 3 is graph showing an example of an output of a simulation for a circuit configured from the block diagram of FIG. 2.

FIG. 3 is a graph that shows an example of an output of the MOHP amplifier 200, constructed according to the principles of the disclosure. As seen in the graph, the MOHP amplifier 200 may output a signal having a value of, for example, greater than about 49 dBm (or 80 W) over an entire range of, for example, about 840 MHz to about 3.2 GHz. The graph shows that the output signal may include a minor dip at, for example, about 2.5 GHz and a major dip at about 2.9 GHz for this frequency range. The MOHP amplifier 200 may achieve an efficiency of, or more than, for example, about 40% for substantially the entire range, except for the dip at about 2.9 GHZ. The dips may be essentially eliminated by optimization of the circuit of the MOHP amplifier 200.

Figure 4:
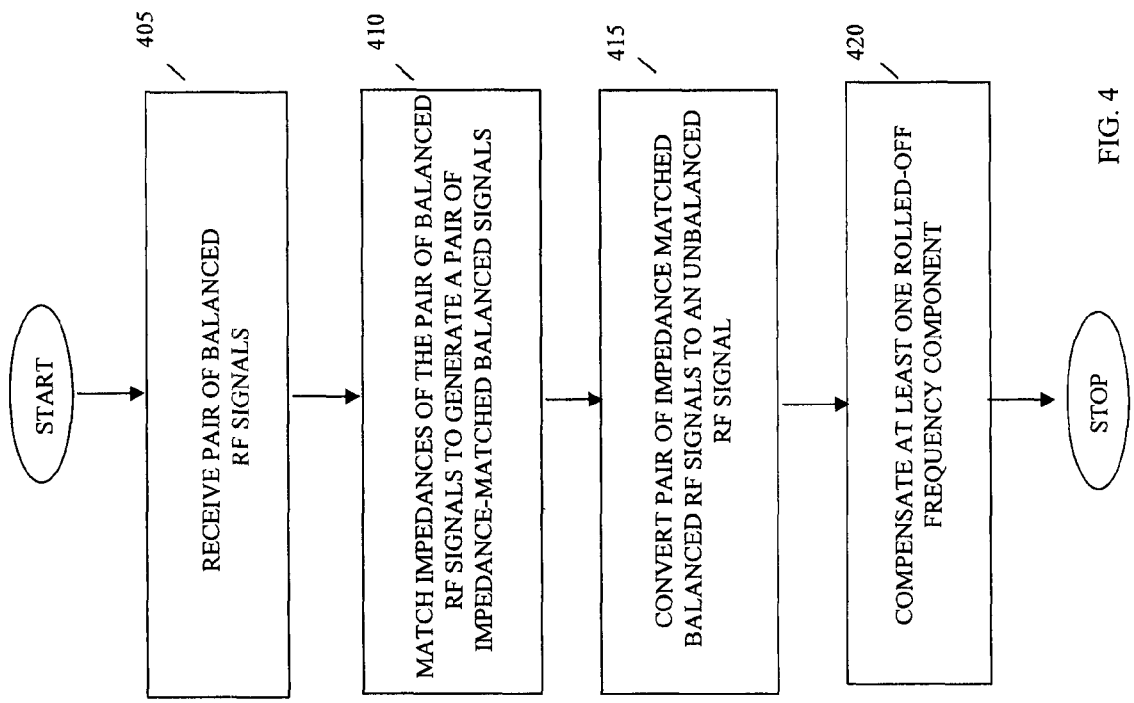
FIG. 4 is a flow diagram of an example of a process for implementing a multi-octave amplifier, the steps performed according to principles of the disclosure.

FIG. 4 is a flow diagram of an example of a process for implementing an MOHP amplifier, performed according to principles of the disclosure. This process may be viewed in relation to FIG. 2. At step 405, a pair of balanced RF signals may be received, such as a first RF signal and a second RF signal at an impedance matching unit. At step 410, the pair of balanced RF signals may be impedance-matched (such as, e.g., by taper transformers) to generate a pair of impedance-matched balanced RF signals, such as a first impedance-matched balanced RF signal and a second impedance-matched balanced RF signal. At step 415, the pair of impedance-matched balanced RF signals may be converted to an unbalanced RF signal. At step 420, at least one rolled-off frequency component of the unbalanced RF signal may be compensated to output a compensated RF signal.

The principles of the disclosure, including the circuit 100 and/or the MOHP amplifier 200 may be utilized in applications that include, for example, ether-communications, stealth microwave, broadband jammers, cellular communications, or the like. The circuit 100 and/or MOHP amplifier 200 may include, for example three-dimension or higher DK materials. The principles of the disclosure may be utilized to provide good performance over, e.g., 1.5, 2, or more octaves for frequency ranges starting at, e.g., 0.5 GHz to 1.0 GHz, or more (or less).

Various modifications and variations of the described methods and systems of the disclosure will be apparent to those skilled in the art without departing from the scope and spirit of the disclosure. Although the disclosure has been described in connection with specific preferred examples, it should be understood that the disclosure as claimed should not be unduly limited to such specific examples. Indeed, various modifications of the described modes for carrying out the disclosure which are obvious to those skilled in the art are intended to be within the scope of the following claims.

What is claimed is:

1. A multi-octave power amplifier, comprising:
an impedance matching unit configured to match impedances of a pair of balanced radio frequency (RF) signals applied thereto and output a pair of impedance-matched balanced RF signals, wherein the pair of balanced RF signals comprises a first balanced RF signal and a second balanced RF signal, and wherein the pair of impedance-matched balanced RF signals comprises a first impedance-matched balanced RF signal and a second impedance-matched balanced RF signal;
a converting unit configured to convert the pair of the impedance-matched balanced RF signals to an unbalanced RF signal; and
a compensation unit configured to compensate at least one rolled-off frequency component of the unbalanced RF signal and output a compensated RF signal;
wherein the impedance matching unit comprises a first matching transformer that receives the first balanced RF signal and outputs the first impedance-matched balanced RF signal; and
wherein the first matching transformer comprises a first tapered transformer.

2. The multi-octave power amplifier of claim 1,
wherein the impedance matching unit comprises
a second matching transformer that receives the second balanced RF signal and outputs the second impedance-matched balanced RF signal.

3. The multi-octave power amplifier of claim 2, wherein a real part of the impedances of the pair of balanced RF signals are between about 3 ohm to about 5 ohm.

4. The multi-octave power amplifier of claim 2, wherein the second matching transformer comprises a second tapered transformer.

5. The multi-octave power amplifier of claim 4, wherein the first tapered transformer and the second tapered transformer are substantially identical.

6. The multi-octave power amplifier of claim 4, wherein the converting unit comprises a balun.

7. The multi-octave power amplifier of claim 6, wherein the balun comprises:
a first input connected to the first matching transformer to receive the first impedance-matched balanced RF signal therefrom;
a second input connected to the second matching transformer to receive the second impedance-matched balanced RF signal therefrom; and
an output connected to the compensation unit to output the unbalanced RF signal thereto.

8. The multi-octave power amplifier of claim 7, wherein the compensation unit comprises a matching filter connected to the output of the balun.

9. The multi-octave power amplifier of claim 8, wherein the matching filter comprises a high pass and low pass (HP/LP) matching filter that compensates the at least one rolled-off frequency component of the unbalanced RF signal.

10. The multi-octave power amplifier of claim 9, wherein the at least one rolled-off frequency component of the unbalanced RF signal comprises:

a rolled-off high frequency component that occupies a high frequency range of the unbalanced RF signal between about 2900 MHz and about 3200 MHz; and a rolled-off low frequency component that occupies a low frequency range of the unbalanced RF signal between about 800 MHz and about 1000 MHz.

11. The multi-octave power amplifier of claim 1, wherein the at least one rolled off frequency component of the unbalanced RF signal is compensated by about 10% to about 20% of bandwidth.

12. A method for amplifying a radio frequency (RF) signal, the method comprising the steps of:
receiving a pair of balanced RF signals;
matching impedances of the pair of balanced RF signals to generate a pair of impedance-matched balanced RF signals, wherein the pair of balanced RF signals comprise a first balanced RF signal and a second balanced RF signal, and the pair of impedance-matched balanced signals comprise a first impedance-matched balanced RF signal and a second impedance-matched balanced RF signal;
converting the pair of impedance-matched balanced RF signals to an unbalanced RF signal; and
compensating at least one rolled-off frequency component of the unbalanced RF signal to output a compensated RF signal;
wherein the first balanced RF signal is transformed to the first impendence-matched balanced RF signal by a first tapered transformer.

13. The method of claim 12, wherein the second balanced RF signal is transformed to the second impendence-matched balanced RF signal by a second tapered transformer.

14. The method of claim 13, wherein the first tapered transformer and the second tapered transformer are substantially identical.

15. The method of claim 13, wherein a real part of the impedances of the pair of balanced RF signals is between about 3 ohm to about 5 ohm.

16. The method of claim 13, wherein the first and second impedance-matched balanced RF signals are converted to the unbalanced RF signal by a balun connected to the first and second tapered transformers.

17. The method of claim 16, wherein the at least one rolled-off frequency component of the unbalanced RF signal comprises:
a rolled-off high frequency component that occupies a high frequency range of the unbalanced RF signal between about 2900 MHz and about 3200 MHz; and
a rolled-off low frequency component that occupies a low frequency range of the unbalanced RF signal between about 800 MHz and about 1000 MHz.

18. The method of claim 17, wherein the rolled-off high and low frequency components of the unbalanced RF signal are compensated by a matching filter.

19. The method of claim 18, wherein the matching filter comprises a high pass and low pass (HP/LP) matching filter connected to the balun.

20. The method of claim 18, wherein the step for compensating compensates the at least one rolled-off frequency component by about 10% to about 20% of bandwidth.

* * * * *